(12) United States Patent
Gille et al.

(10) Patent No.: US 9,343,648 B2
(45) Date of Patent: May 17, 2016

(54) METHOD FOR MANUFACTURING A THERMOELECTRIC DEVICE, PARTICULARLY INTENDED TO GENERATE AN ELECTRIC CURRENT IN A MOTOR VEHICLE, AND THERMOELECTRIC DEVICE OBTAINED BY SUCH A METHOD

(75) Inventors: Gerard Gille, Thorigne en Charnie (FR); Patrick Boisselle, Laval (FR)

(73) Assignee: VALEO SYSTEMES THERMIQUES, Le Mesnil Saint Denis (FR)

( * ) Notice: Subject to any disclaimer, the term of this patent is extended or adjusted under 35 U.S.C. 154(b) by 0 days.

(21) Appl. No.: 14/129,653

(22) PCT Filed: Jun. 28, 2012

(86) PCT No.: PCT/EP2012/062589
§ 371 (c)(1),
(2), (4) Date: Feb. 18, 2014

(87) PCT Pub. No.: WO2013/001016
PCT Pub. Date: Jan. 3, 2013

(65) Prior Publication Data
US 2014/0182647 A1   Jul. 3, 2014

(30) Foreign Application Priority Data

Jun. 30, 2011 (FR) ..................... 11/02059

(51) Int. Cl.
*H01L 35/30* (2006.01)
*H01L 21/00* (2006.01)
(Continued)

(52) U.S. Cl.
CPC ............. *H01L 35/32* (2013.01); *B05B 7/226* (2013.01); *C23C 4/02* (2013.01); *C23C 4/08* (2013.01); *C23C 4/134* (2016.01); *H01L 35/08* (2013.01); *H01L 35/34* (2013.01)

(58) Field of Classification Search
None
See application file for complete search history.

(56) References Cited

U.S. PATENT DOCUMENTS 4,757,934 A * 7/1988 Greenstein ................. 228/123.1
7,361,869 B2   4/2008 Russegger
(Continued)

FOREIGN PATENT DOCUMENTS

JP   2000-164943 A   6/2000
WO   WO 03/052776 A2   6/2003

OTHER PUBLICATIONS

International Search Report for Application No. PCT/EP2012/062589 dated Aug. 6, 2012, 5 pages.
(Continued)

*Primary Examiner* — Eli Mekhlin
(74) *Attorney, Agent, or Firm* — Howard & Howard Attorneys PLLC

(57) ABSTRACT

The invention relates to a method of manufacturing a thermoelectric device comprising a plurality of thermoelectric components (4) for creating an electric current from a temperature gradient applied between two faces (3a, 3b) thereof. In the method, a thermally conductive support (30) is provided in contact with a hot or cold source, a thermally conductive and electrically insulating material is thermally sprayed on the support (30) to produce a coating (21), and an electrically conductive material is thermally sprayed onto the coating (21) to form electric conduction tracks (22) which are intended to receive the thermoelectric components (4) via the faces (3a, 3b) thereof. The invention also relates to a thermoelectric device obtained by the method.

20 Claims, 2 Drawing Sheets

Figure 1:
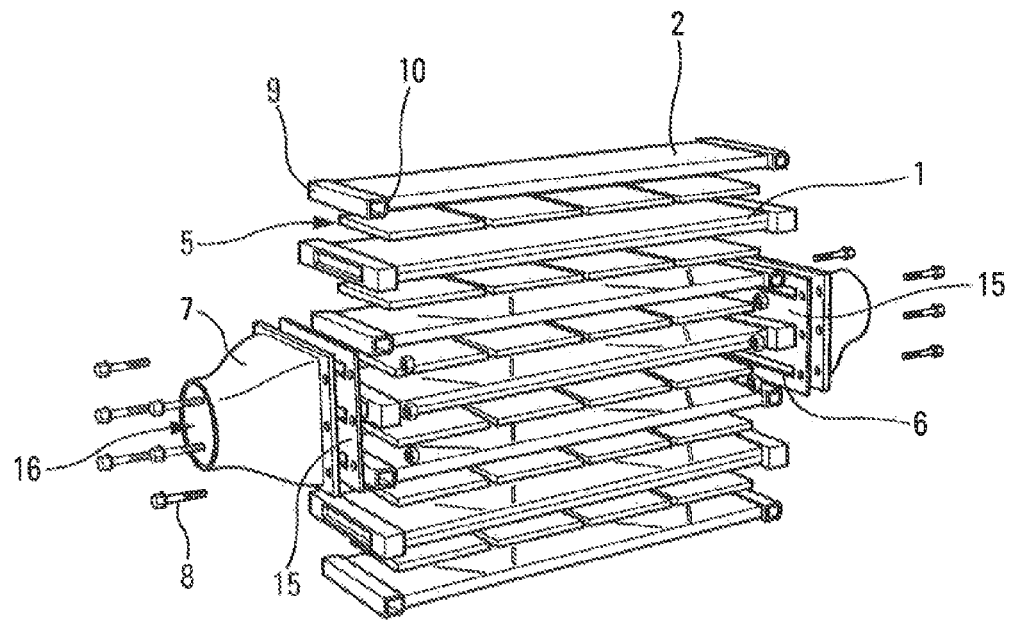

(51) Int. Cl.
*H01L 35/32* (2006.01)
*H01L 35/08* (2006.01)
*H01L 35/34* (2006.01)
*C23C 4/02* (2006.01)
*C23C 4/08* (2016.01)
*B05B 7/22* (2006.01)

(56) References Cited

U.S. PATENT DOCUMENTS

| | | | | |
|---|---|---|---|---|
| 2001/0013224 A1* | 8/2001 | Ohkubo et al. | | 62/3.7 |
| 2003/0140957 A1* | 7/2003 | Akiba | | H01L 35/30 136/224 |
| 2004/0261830 A1* | 12/2004 | Sharp et al. | | 136/201 |
| 2005/0045702 A1* | 3/2005 | Freeman | | B23K 1/0016 228/254 |
| 2008/0245398 A1* | 10/2008 | Bell et al. | | 136/224 |
| 2009/0301541 A1* | 12/2009 | Watts | | H01L 35/00 136/205 |
| 2010/0108115 A1* | 5/2010 | Lee | | H01L 35/26 136/236.1 |
| 2011/0067742 A1* | 3/2011 | Bell et al. | | 136/204 |

OTHER PUBLICATIONS

English language abstract and machine-assisted English translation for JP 2000-164943 extracted from the PAJ database on May 21, 2014, 57 pages.

English language abstract for WO 03/052776 extracted from espacenet.com database on May 21, 2014, 29 pages.

* cited by examiner

METHOD FOR MANUFACTURING A
THERMOELECTRIC DEVICE,
PARTICULARLY INTENDED TO GENERATE
AN ELECTRIC CURRENT IN A MOTOR
VEHICLE, AND THERMOELECTRIC
DEVICE OBTAINED BY SUCH A METHOD

RELATED APPLICATIONS

This application is the National Stage of International Patent Application No. PCT/EP2012/062589, filed on Jun. 28, 2012 which claims priority to and all the advantages of French Patent Application No. FR 11/02059, filed on Jun. 30, 2011, the content of which is incorporated herein by reference.

The present invention relates to a method of manufacturing a thermoelectric device, particularly intended to generate an electric current in a motor vehicle, and a thermoelectric device obtained by such a method.

Thermoelectric devices have already been proposed which use so-called thermoelectric components for generating an electric current in the presence of a temperature gradient between two of the opposite faces thereof according to the phenomenon known as Seebeck effect. These devices comprise a stack of first tubes, for circulating the exhaust gases of an engine, and of second tubes, for circulating a heat-carrying fluid of a cooling circuit. The thermoelectric components are sandwiched between the tubes such as to be subjected to a temperature gradient resulting from the difference in temperature between the hot exhaust gases and the cold cooling fluid.

Such devices are particularly advantageous as they allow electricity to be produced by converting the heat from the exhaust gases of the engine. They therefore offer the possibility of reducing the consumption of fuel of the vehicle by replacing, at least partially, the alternator normally provided therein in order to generate electricity from a belt driven by the crankshaft of the engine.

In order to have available a current and a voltage of a sufficiently high level, it is necessary to connect the thermo-components with each other, in series and/or in parallel, using electric conduction tracks, provided at the surface of the tubes. In this case, since the tubes are metal, a thermally conductive and electrically insulating coating is provided between the tubes and the electric conduction tracks in order to prevent the creation of a short circuit between the electric conduction tracks, while allowing the transfer of heat between the heat-carrying fluid circulating in the tubes and the thermoelectric components.

Various methods of producing tubes having such a coating and such conduction tracks have already been proposed but they are not satisfactory in view of the difficulties thereof and the industrialization costs thereof.

The aim of the present invention is to improve the situation and, to this end, the present invention proposes a method of manufacturing a thermoelectric device comprising a plurality of so-called thermoelectric components for creating an electric current from a temperature gradient applied between two of the faces thereof, called contact faces, method wherein a thermally conductive support is provided in contact with a hot or cold source, a thermally conductive and electrically insulating material is thermally sprayed on all or part of said support such as to produce a coating, called a primary coating, and an electrically conductive material is thermally sprayed onto the primary coating such as to form electric conduction tracks, which are intended to receive the thermoelectric components via the contact faces thereof.

Manufacture is facilitated by producing the primary coating and the conduction tracks both by thermal spraying. Indeed, in view of the common operating principles of the thermal spraying methods, it will be possible to share at least some of the tools, fluids or other resources used for spraying the materials used.

Such a method has, moreover, the advantage of providing a good degree of flatness of the surfaces in contact with the thermoelectric components. Providing a good degree of flatness at this level is, indeed, decisive in order to obtain good thermal conduction between the thermally conductive support and the thermoelectric components and therefore effective operation of the manufactured thermoelectric devices.

Said primary coating is produced, for example, by plasma spraying the thermally conductive and electrically insulating material.

The electric conduction tracks are produced, for example, by plasma spraying the electrically conductive material.

In particular, said primary coating and said electric conduction tracks can both be produced by plasma spraying.

According to various embodiments which can be taken together or separately:
    said thermally conductive and electrically insulating material is a ceramic, particularly alumina,
    said electrically conductive material is chosen from copper or nickel,
    the thermoelectric components are fixed on the electric conduction tracks, particularly by soldering,
    a material for allowing the thermoelectric components to be soldered on said electric conduction tracks is sprayed with the electrically conductive material,
    the thermally conductive support is a tube and the primary coating is sprayed at several separate areas of the surface of said tube.

The invention also relates to a thermoelectric device obtained using the method described above.

Figure 2:
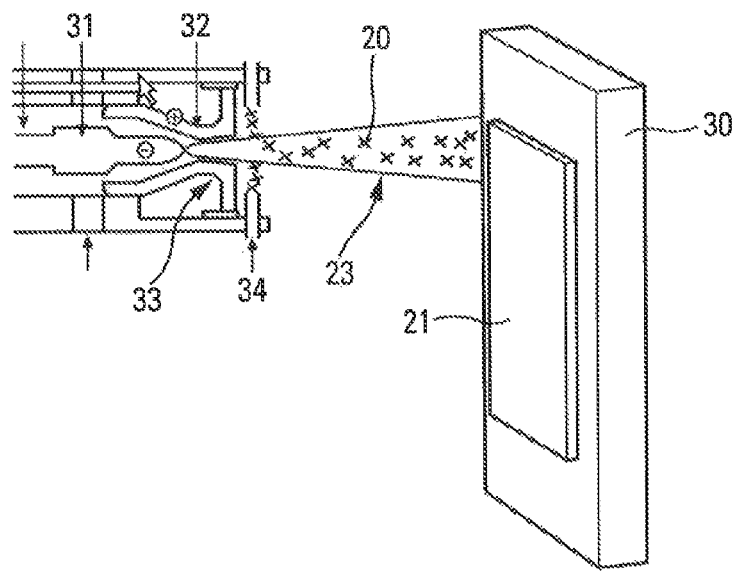
Figure 3:
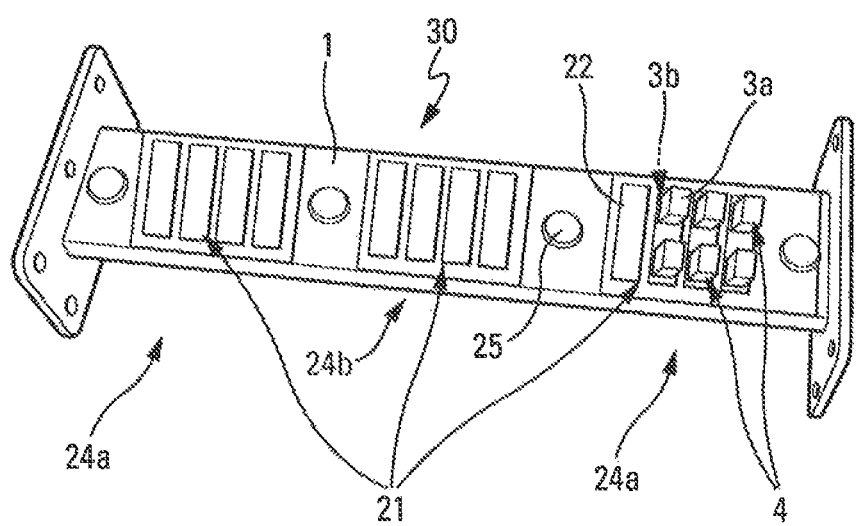

The invention will be better understood in light of the following description which is only provided indicatively and in a non-limiting manner, with reference to the appended drawings wherein:

FIG. 1 is a perspective illustration of a thermoelectric device example in accordance with the invention, which example is shown in an exploded view, FIG. 2 is a schematic perspective illustration of the first step for carrying out the method in accordance with the invention, which method is used for a thermally conductive support defined by a tube, FIG. 3 is a schematic perspective illustration of a tube obtained by an example of carrying out the method in accordance with the invention.

As illustrated in FIG. 1, the device in accordance with the invention comprises thermal conduction supports in contact with a hot or cold source such as a plurality of tubes 1 for circulating a first fluid alternating with a plurality of tubes 2 for circulating a second fluid. Said tubes 1, 2 extend, in this case, parallel to one another in a same direction.

The tubes 1 for circulating the first fluid are configured, for example, for circulating a so-called hot fluid. This can be the exhaust gases of a motor vehicle thermal engine. The tubes 2 for circulating the second fluid are configured, for example, for circulating a so-called cold fluid having a lower temperature than the temperature of the first fluid. This can be a coolant, such as a mixture of water and glycol, coming, for example, from a low temperature cooling loop of the vehicle.

In this case, there are three exhaust gas circulating tubes 1 and five tubes 2 for circulating the coolant.

Said device further comprises a plurality of so-called thermoelectric components for creating an electric current from a temperature gradient applied between two of the faces thereof, called contact faces, provided at the contact point of said tubes 1, 2 for circulating the first and the second fluid.

These are, for example, components 4 with a substantially parallelepiped shape (schematically shown in FIG. 3) generating an electric current, according to the Seebeck effect. Such components allow the generation of an electric current in a load connected between said contact faces 3a, 3b, which are provided in an opposite manner. In a manner known to a person skilled in the art, such components are made up, for example, of bismuth and tellurium ($Bi_2Te_3$).

The thermoelectric components 4 can be, for a first part, components of a first so-called P-type for establishing a difference in electric potential in one so-called positive direction, when they are subjected to a given temperature gradient, and, for the other part, components of a second so-called N-type allowing the creation of a difference in electric potential in an opposite so-called negative direction when they are subjected to the same temperature gradient.

As illustrated in FIG. 1, the thermoelectric components 4 are split into sheets 5 provided between the tubes 1 for circulating the first fluid and the tubes 2 for circulating the second fluid.

As expanded upon below, the thermoelectric components applied on a same tube 1, 2 are electrically connected. In particular, the P-type thermoelectric components and the N-type thermoelectric components, provided between a same tube for circulating the first fluid and a same tube for circulating the second fluid, can be interconnected such as to allow the circulation of the current in series from a component of the first type to a component of the second type. The thermoelectric components connected in this manner form a base conduction cell and the obtained cells can be connected in series and/or in parallel. Inside a single conduction cell, thermoelectric components of a same type can be connected in parallel.

An electrical connector, which is not shown, allows the device to be connected to an external electric circuit. In the device, electric connections are established between the sheets 5 of thermoelectric components such as to transmit to the circuit the current generated by all of said thermoelectric components, via said connector.

Said circulating tubes 1, 2 have, for example, a flattened section in an elongation direction, which is orthogonal to the extension direction of the tubes. Said circulating tubes 1, 2 can, therefore, be flat tubes. This means that they have two large parallel faces connected by small sides. The thermoelectric components 4 are in contact with one and/or the others of the flat faces of the tubes 1, 2 via the contact faces 3a, 3b thereof.

Said tubes 1, 2 have, for example, multiple channels. Said tubes 2 for circulating the cold fluid are made up, for example, of aluminium and/or aluminium alloy. In particular, they are extruded. The channels thereof can have a round cross-section. The tubes 1 for circulating the hot fluid are made up, in particular, of stainless steel. They are formed, for example, by shaping, welding and/or soldering. The fluid passage channels thereof are separated, particularly, by partitions connecting the opposite flat faces of the tubes.

Said device further comprises, for example, a manifold plate 15 at each of the ends of said tubes 1 for circulating the first fluid. Said manifold plate 15 is provided with openings 6 in which the ends of said tubes 1 for circulating the first fluid are inserted.

Said device can also comprise manifold boxes 7 which are in fluid communication with the end of said tubes 1 for circulating the first fluid and fixed to the manifold plates 5 by means of screws 8. Said boxes comprise an opening 16 for the inlet and/or outlet of the first fluid.

Said tubes 2 for circulating the second fluid can be provided at each of the ends thereof with manifolds 9 allowing communication of said tubes 2 for circulating the second fluid and of a manifold box, which is not shown, for the second fluid by means of openings 10 opening onto a side face of the bundle defined by the stack of the tubes 1, 2 for circulating the first and the second fluid.

The invention also relates to a manufacturing method for obtaining such a device and more particularly the tubes of said device.

As illustrated in FIG. 2, in a first step, a thermally conductive and electrically insulating material 20 is thermally sprayed on all or part of said thermally conductive support, in this case with the reference 30, such as to produce a coating 21, called a primary coating.

Said primary coating 21 is produced, for example, by plasma spraying the thermally conductive and electrically insulating material 20.

Said thermally conductive and electrically insulating material 20 is made up, particularly, of a ceramic such as alumina. The obtained primary coating 21 is therefore principally made up of alumina but it can, of course, comprise impurities due, in particular, to the greater or lesser purity of the starting material used for spraying, to the cleanliness of the thermally conductive support and/or to the spraying method itself.

As illustrated in FIG. 3, electric conduction tracks 22 are also provided, which are intended to receive the thermoelectric components 4 via the contact faces 3a, 3b thereof. This is achieved, in a second step, by carrying out another thermal spraying, this time of an electrically conductive material, on the primary coating 21.

This can again be plasma spraying, particularly of copper or nickel. The obtained conduction tracks 22 are therefore principally made up of copper or nickel but they can, of course, comprise impurities due, in particular, to the greater or lesser purity of the starting material used for spraying, to the cleanliness of the support and/or to the spraying method itself.

By using the same production principal for the primary coating 21 and the thermal conduction tracks 22, namely thermal spraying, manufacture is facilitated as a result of sharing resources which is made possible due to the similarities thereof. For example, one similarity between the various thermal spraying methods is the use of a carrier gas used to transport the material to be sprayed onto the support. Moreover, a good degree of flatness of the coatings is obtained.

In particular, the primary coating 21 and the conduction tracks 22 can be produced using the same spraying tool.

As is illustrated in FIG. 2 in the case of plasma spraying, this is a tool comprising, for example, a plasma gas supply as well as an anode 31 and a cathode 32 allowing the creation of a plasma jet 23 through a nozzle 33, the jet being directed towards the support 30. The tool further comprises injectors 34 for directing the material to be sprayed, in this case alumina for the first step and copper or nickel for the second step, in the direction of the plasma jet 23.

In this case, it will also be possible to use other methods of thermal spraying such as, for example, spraying under the effect of a flow generated by combustion, such as the method known as High Velocity Oxygen Fuel, particularly for the production of the electric conduction tracks 22, in particular in the case of tracks 22 produced from copper.

According to an example of implementing the method in accordance with the invention, the thermoelectric components 4 are fixed on the electric conduction tracks 22, for example by soldering, as can be seen from FIG. 4.

To this end, a material for allowing the thermoelectric components 4 to be soldered on said electric conduction tracks 22 can be sprayed with the electrically conductive material.

Furthermore, the primary coating 21 can be sprayed at several separate areas 24*a*, 24*b*, 24*c*, which are provided, for example, at the surface of the tubes 1, 2 for circulating the first and/or second fluid. In other words, the primary coating 21 areas 24*a*, 24*b*, 24*c* are separated from one another. In this case, protuberances 25 are provided at the surface of the tubes 1, 2 for circulating the first and/or the second fluid of the tube between each primary coating 21 area 24*a*, 24*b*, 24*c*.

The electric conduction tracks 22 can be specific to each said primary coating 21 area 24*a*, 24*b*, 24*c*. They are, for example, parallel to one another inside each of said primary coating 21 areas 24*a*, 24*b*, 24*c*.

Of course, the device described above, with reference to FIG. 1, is only one thermoelectric device example obtained by the method in accordance with the invention which can be used for devices having many other configurations. In particular, the thermal conduction supports provided with said primary coating and said electric conduction tracks can be tubes having other shapes, made from other materials or arranged differently. They can still be thermal conduction blades.

The invention claimed is:

1. A method of manufacturing a thermoelectric device comprising a plurality of thermoelectric components for creating an electric current from a temperature gradient applied between a first face and a second face thereof, said method comprising:
   providing, a first thermally conductive support comprising a first tube in contact with a hot source and a second thermally conductive support comprising a second tube in contact with a cold source;
   providing a pair of manifold plates, each of the pair of manifold plates having at least one opening;
   inserting a respective end of the first tube within one of the at least one openings of a respective one of the pair of manifold plates;
   positioning opposing ends of the second tube between the pair of manifold plates;
   inserting an other respective end of the first tube within one of the at least one openings of the other respective one of the pair of manifold plates;
   thermally spraying a first thermally conductive and electrically insulating material on all or part of the first thermally conductive support to produce a first coating;
   thermally spraying a second thermally conductive and electrically insulating material on all or part of the second thermally conductive support to produce a second coating, the second thermally conductive and electrically insulating material the same or different than the first thermally conductive and electrically insulating material;
   thermally spraying a first electrically conductive material onto the first coating to form a first electric conduction track;
   thermally spraying a second electrically conductive material onto the second coating to form a second electric conduction track, the second electrically conductive material the same or different than the first electrically conductive material; and
   positioning one of the plurality of thermoelectric components such that the first face is in contact with the first electric conduction track and the second face is in contact with the second electric conduction track.

2. A method according to claim 1, wherein the first coating and second coating are produced by plasma spraying the respective first and second thermally conductive and electrically insulating material.

3. A method according to claim 2, wherein the first coating and the first electric conduction track are produced using the same spraying tool.

4. A method according to claim 2, wherein the first and second electric conduction tracks are produced by plasma spraying the respective first and second electrically conductive material.

5. A method according to claim 4, wherein the second coating and the second electric conduction track are produced using the same spraying tool.

6. A method according to claim 1, wherein the first and second electric conduction tracks are produced by plasma spraying the respective first and second electrically conductive material.

7. A method according to claim 1, wherein the first coating and the first electric conduction track are produced using the same spraying tool.

8. A method according to claim 1, wherein the first and second thermally conductive and electrically insulating material is alumina.

9. A method according to claim 8, wherein the first and second electrically conductive material is chosen from copper or nickel.

10. A method according to claim 1, wherein the first and second electrically conductive material is chosen from copper or nickel.

11. A method according to claim 1, wherein a respective one of the thermoelectric components is fixed on a respective one of the first or second electric conduction tracks by soldering.

12. A method according to claim 11, wherein each respective one of the thermoelectric components is fixed on a respective one of the first and second electric conduction tracks by soldering.

13. A method according to claim 1, wherein a material for allowing the thermoelectric components to be soldered on the first or second electric conduction tracks is sprayed with the respective first and second electrically conductive material.

14. A method according to claim 1, wherein the first coating is sprayed at several separate areas of the surface of the first tube.

15. A method according to claim 14, wherein the second coating is sprayed at several separate areas of a surface of the second tube.

16. A method according to claim 15, wherein a surface the first tube, the surface of the second tube, or both the surfaces of the respective first tube and second tube includes protuberances between the separate areas.

17. A thermoelectric device obtained according to the method of claim 1.

18. A method according to claim 1, wherein the second coating and the second electric conduction track are produced using the same spraying tool.

19. A method according to claim 1, wherein each respective one of the thermoelectric components is fixed on a respective one of the second electric conduction tracks by soldering.

20. A method according to claim 1, wherein each one of the manifold plates is secured to a manifold box having an opening such that each of the respective manifold boxes is in fluid communication with the first tube through the respective manifold plate.

* * * * *